(12) United States Patent
Kaitoh et al.

(10) Patent No.: US 8,247,817 B2
(45) Date of Patent: Aug. 21, 2012

(54) LIQUID CRYSTAL DISPLAY DEVICE

(75) Inventors: Takuo Kaitoh, Mobara (JP); Hidekazu Miyake, Mobara (JP); Takeshi Sakai, Kokubunji (JP); Terunori Saitou, Mobara (JP)

(73) Assignees: Hitachi Displays, Ltd., Chiba-ken (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 637 days.

(21) Appl. No.: 12/379,874

(22) Filed: Mar. 3, 2009

(65) Prior Publication Data

US 2009/0224247 A1    Sep. 10, 2009

(30) Foreign Application Priority Data

Mar. 6, 2008    (JP) .................. 2008-056702

(51) Int. Cl.
*H01L 29/04* (2006.01)
*H01L 29/10* (2006.01)
*H01L 31/00* (2006.01)

(52) U.S. Cl. ............ 257/59; 257/E29.294; 257/E33.004

(58) Field of Classification Search .................. 257/59, 257/66, 72, E33.003, E29.273, E29.27, E29.117, 257/E29.147, E29.294, E29.291
See application file for complete search history.

(56) References Cited

U.S. PATENT DOCUMENTS

| | | | | |
|---|---|---|---|---|
| 5,851,440 | A * | 12/1998 | Tanaka et al. ..................... | 257/66 |
| 7,517,464 | B2 * | 4/2009 | Matsushita et al. ............ | 216/23 |
| 2009/0050896 | A1 * | 2/2009 | Kaitoh et al. .................... | 257/72 |
| 2009/0065777 | A1 * | 3/2009 | Oue et al. ......................... | 257/59 |
| 2009/0153056 | A1 * | 6/2009 | Chen et al. ....................... | 315/51 |
| 2009/0218575 | A1 * | 9/2009 | Miyake et al. ................... | 257/72 |
| 2009/0224247 | A1 * | 9/2009 | Kaitoh et al. .................... | 257/59 |
| 2009/0225251 | A1 * | 9/2009 | Kaitoh et al. .................... | 349/46 |
| 2010/0032673 | A1 * | 2/2010 | Saitou et al. ..................... | 257/59 |
| 2010/0102322 | A1 * | 4/2010 | Matsumura et al. ............ | 257/59 |

FOREIGN PATENT DOCUMENTS

JP    05-055570    8/1991

* cited by examiner

*Primary Examiner* — Matthew Landau
*Assistant Examiner* — Latanya N Crawford
(74) *Attorney, Agent, or Firm* — Stites & Harbison, PLLC; Juan Carlos A. Marquez, Esq.

(57) ABSTRACT

In a bottom-gate-type thin film transistor used in a liquid crystal display device in which a poly-Si layer and an a-Si layer are stacked, a quantity of an ON current which flows in the thin film transistor can be increased. A poly-Si layer and an a-Si layer are stacked on a gate electrode as an active layer by way of a gate insulation film therebetween in order of the poly-Si layer and the a-Si layer. An n+Si layer and a source/drain layer are formed on the a-Si layer thus forming a thin film transistor. A forward current which flows in the thin film transistor mainly flows in the poly-Si layer. To decrease contact resistance against the forward current between the poly-Si layer and the n+Si layer, an edge portion of the a-Si layer and an edge portion of the poly-Si layer assume a concavo-convex shape thus particularly increasing a contact area between the poly-Si layer and the n+Si layer whereby the contact resistance against the forward current can be decreased leading to the increase of a quantity of an ON current.

6 Claims, 10 Drawing Sheets

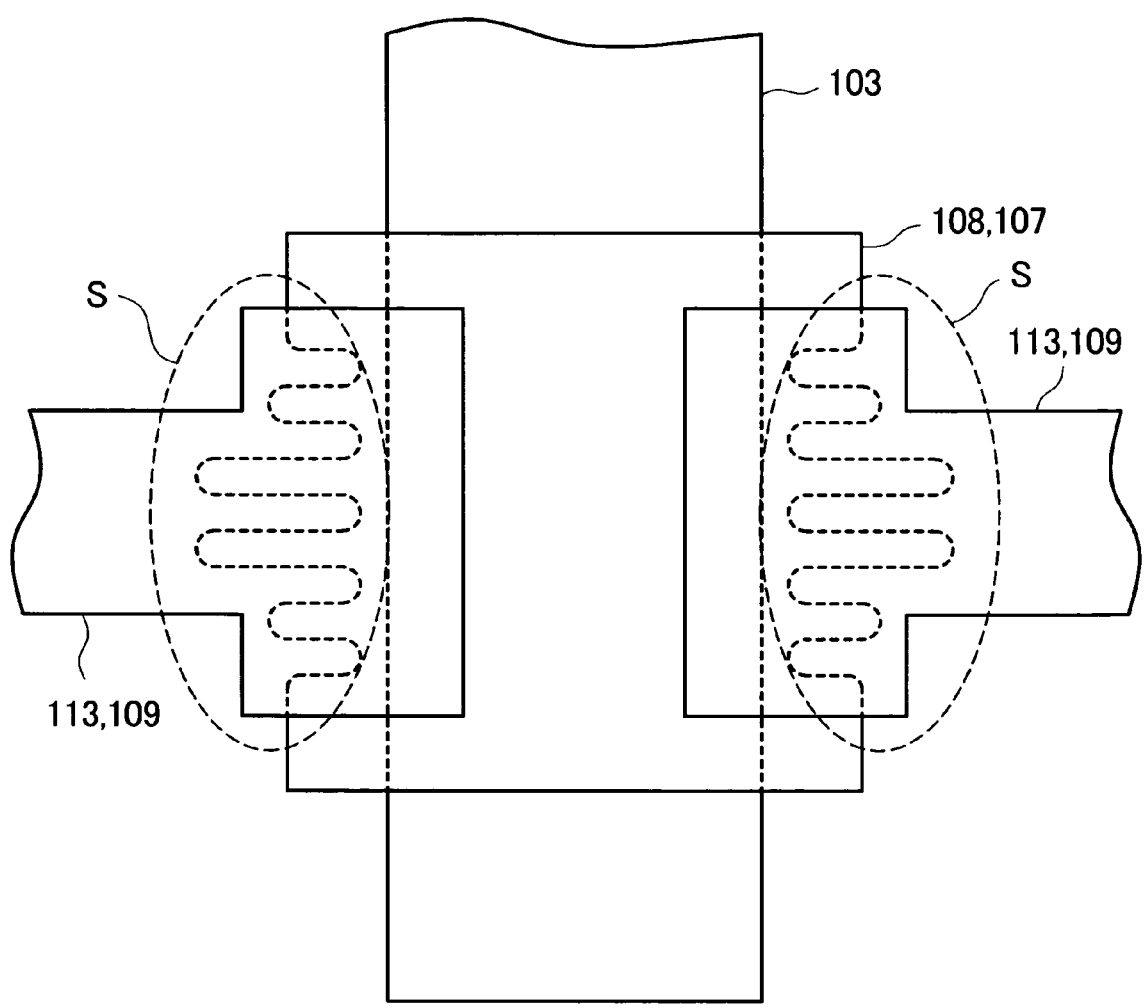

B - B

A – A

PRIOR ART

A – A

LIQUID CRYSTAL DISPLAY DEVICE

CLAIM OF PRIORITY

The present application claims priority from Japanese application serial No. 2008-56702, filed on Mar. 6, 2008, the content of which is hereby incorporated by reference into this application.

BACKGROUND OF THE INVENTION

1. Field of the Invention

The present invention relates to a display device, and more particularly to a liquid crystal display device which forms pixels using thin film transistors (TFTs) as switching elements in a display region and arranges a driver circuit formed of a TFT whose channel portion is made of poly-Si on the periphery of the display region.

2. Description of the Related Art

In a liquid crystal display device, a TFT substrate on which pixel electrodes, thin film transistors (TFTs) and the like are formed in a matrix array and a color filter substrate on which color filters and the like are formed at positions corresponding to the pixel electrodes are arranged to face each other in an opposed manner, and liquid crystal is sandwiched between the TFT substrate and the color filter substrate. Optical transmissivity of liquid crystal molecules is controlled for every pixel so as to form an image.

On the TFT substrate, data lines which extend in the longitudinal direction and are arranged parallel to each other in the lateral direction and scanning lines which extend in the lateral direction and are arranged parallel to each other in the longitudinal direction are formed, and the pixel is formed in a region surrounded by the data lines and the scanning lines. The pixel is mainly constituted of a pixel electrode and the TFT which constitutes a switching element. A display region is formed by arranging a large number of pixels having such constitution in a matrix array.

Outside the display region, a scanning line driver circuit which drives the scanning lines and a data line driver circuit which drives the data lines are arranged. Conventionally, the scanning line driver circuit and the data line driver circuit are formed by externally mounting an IC driver. This IC driver may be connected to the TFT substrate using a tape carrier method or the like or may be directly mounted on the TFT substrate using a chip-on method.

On the other hand, to satisfy the demand for the miniaturization of the whole display device while ensuring the display region or the like, a technique which forms a driver circuit on the periphery of the display region using a TFT has been developed. In such a display device, the TFT formed in the display region uses amorphous silicon (a-Si) for forming a channel portion thereof, and the TFT formed in the driver circuit part uses polysilicon (poly-Si) for forming a channel portion thereof. That is, a-Si which exhibits a small leak current is used for forming the channel portion of the TFT in the display region, while poly-Si which exhibits large mobility of electrons is used for forming the channel portion of the TFT in the driver circuit part.

In general, the TFT which uses a-Si for forming the channel portion adopts the bottom gate structure, while the TFT which uses poly-Si for forming the channel portion adopts the top gate structure. Accordingly, the TFTs which differ in structure are formed on one substrate and hence, the manufacturing process becomes complicated.

JP-A-5-55570 (patent document 1) discloses a display device which is, to prevent a manufacturing process from becoming complicated, configured such that a TFT which uses poly-Si for forming a channel portion thereof also adopts the bottom gate structure. In this constitution, a poly-Si layer which constitutes a channel is firstly formed on a gate insulation film which is formed on a gate electrode and, thereafter, an a-Si layer is formed on the poly-Si layer. A contact layer which is constituted of an n+ layer is formed on the a-Si layer, and a source/drain electrode (SD electrode) is formed on the contact layer. By allowing the TFT which uses poly-Si for forming the channel portion thereof to adopt such constitution, the number of common processes which are shared by a TFT which uses a-Si for forming a channel portion thereof and the TFT which uses poly-Si for forming the channel portion thereof is increased and hence, the entire process is simplified.

SUMMARY OF THE INVENTION

In the technique disclosed in patent document 1, the poly-Si layer is formed on the gate insulation layer which is formed on the gate electrode, the a-Si layer is formed on the poly-Si layer, and the n+ layer is formed on the a-Si layer so as to form a contact layer. In such constitution, an ON current flows in the poly-Si layer which exhibits large mobility when the transistor is turned on. However, this constitution has a drawback that a leak current is generated when the transistor is turned off.

FIGS. 10A and 10B shows the constitution of a TFT having a channel portion made of poly-Si which is substantially equal to the constitution of the TFT disclosed in patent document 1. FIG. 10A is a plan view of the TFT, and FIG. 10B is a cross-sectional view taken along a line A-A in FIG. 10A. In FIG. 10A, a poly-Si layer 107 is formed on a gate electrode 103 with a gate insulation film 104 sandwiched therebetween, and an a-Si layer 108 is formed on the poly-Si layer 107 in a stacked manner. An SD electrode 113 is formed on the a-Si layer 108 by way of an n+Si layer 109.

FIG. 10B shows the detailed cross section of the constitution shown in FIG. 10A. In FIG. 10B, the gate electrode 103 is formed on a background film 102, and the gate insulation film 104 is formed so as to cover the gate electrode 103. The poly-Si layer 107 is formed on the gate insulation film 104, and the a-Si layer 108 is formed on the poly-Si layer 107. The n+Si layer 109 is formed on the a-Si layer 108. The a-Si layer 108 and the n+Si layer 109 are formed by photolithography using the same mask and hence, the a-Si layer 108 and the n+Si layer 109 have the same planar shape. The SD electrode 113 is formed on the n+Si layer 109. The SD electrode 113 is constituted of a barrier metal layer 110 made of molybdenum, an aluminum layer 111 and a cap metal layer 112 made of molybdenum.

In the constitution shown in FIGS. 10A and 10B, there arises no particular problem when a plus voltage is applied to the gate electrode 103 so as to allow an ON current to flow in the TFT. However, when a zero voltage or a minus voltage is applied to the gate electrode 103 so as to turn off the TFT, there observed is a phenomenon that the TFT is not turned off. So long as such a phenomenon exists, the TFT cannot function as a switching element. The reason that such a phenomenon occurs is considered as follows.

In FIG. 10B, when the minus voltage is applied to the gate electrode 103, holes are induced in the poly-Si layer 107. There is no potential barrier between the poly-Si layer 107 and the barrier metal 110 of the SD electrode 113. Accordingly, an electric current generated by the holes directly flows in the SD electrode 113. Accordingly, the TFT is not turned off.

FIGS. 11A and 11B shows the structure of a TFT which overcomes such a drawback. FIG. 11A is a plan view of the TFT, and FIG. 11B is a cross-sectional view taken along a line A-A in FIG. 11A. FIG. 11A is substantially equal to FIG. 10A as a plan view and hence, the explanation of the constitution as viewed in a plan view is omitted.

FIG. 11B is the cross-sectional view taken along a line A-A in FIG. 11A. A point which makes the constitution shown in FIG. 11B different from the constitution shown in FIG. 10B lies in that the n+Si layer extends not only over the a-Si layer but also over a side portion of the a-Si layer and a side portion of the poly-Si layer. The n+Si layer is brought into contact with the poly-Si layer and hence, a depletion layer is formed in the contact portion thus preventing the occurrence of a leak current. Accordingly, it is possible to overcome the problem explained in conjunction with FIGS. 10A and 10B.

However, in the TFT having the constitution shown in FIG. 11B, mobility of carriers in the poly-Si layer is one hundred times or more as large as mobility of carriers in the a-Si layer and hence, an ON current mainly flows in the poly-Si layer.

In the constitution shown in FIG. 11B, the n+Si layer is brought into contact with an upper portion as well as a side portion of the a-Si layer and hence, a contact area between the n+Si layer and the a-Si layer is large. However, the n+Si layer is brought into contact with only a side portion of the poly-Si layer. A contact area between the n+Si layer and the poly-Si layer is small and hence, the resistance generated when the TFT is turned on becomes large so that the ON current is restricted. As a result, the constitution shown in FIGS. 11A and 11B cannot sufficiently enjoy an advantageous effect acquired by the formation of the poly-Si TFT.

Accordingly, it is an object of the present invention to provide a technique which can increase an ON current which flows in a bottom-gate-type TFT in which a poly-Si layer and an a-Si layer are formed in a stacked manner.

To overcome the above-mentioned drawbacks, according to one aspect of the present invention, a contact area where an n+Si layer is in contact with a side portion (edge portion) of a poly-Si layer is increased so as to reduce resistance against an ON current thus increasing a quantity of the ON current. For this end, a side portion (edge portion) of the a-Si layer and the side portion of the poly-Si layer which are respectively brought into contact with the n+Si layer are not formed in a linear shape but is formed in a concavo-convex shape and hence, the contact area between the n+Si layer and the side portion of the poly-Si layer can be increased. The concavo-convex shape may assume various shapes.

Further, according to another aspect of the present invention, a through hole is formed in the a-Si layer and the poly-Si layer so as to bring the poly-Si layer and the n+Si layer into contact with each other via the through hole. Due to such constitution, the contact area between the a-Si layer and the poly-Si layer is increased and hence, a quantity of the ON current can be increased.

To explain specific constitutions of the liquid crystal display device of the present invention, they are as follows.

(1) According to one aspect of the present invention, there is provided a liquid crystal display device which includes: a display region in which pixel electrodes and pixel-use TFTs are arranged in a matrix array; and a driver circuit which includes a driver circuit-use TFT and is formed on a periphery of the display region, wherein the pixel-use TFT is a bottom-gate-type TFT in which an active layer is formed of an a-Si layer, the driver circuit-use TFT is a bottom-gate-type TFT in which an active layer is formed by stacking a poly-Si layer and an a-Si layer in order of the poly-Si layer and the a-Si layer, an n+Si layer is formed so as to cover the a-Si layer and the poly-Si layer, and an SD electrode is formed so as to cover the n+Si layer, and a side of the poly-Si layer which is brought into contact with the n+Si layer assumes a concavo-convex shape.

(2) In the liquid crystal display device having the above-mentioned constitution (1), the concavo-convex shape is a rectangular-wave concavo-convex shape.

(3) In the liquid crystal display device having the above-mentioned constitution (2), a depth of the concavo-convex shape is set to 0.5 μm or more.

(4) In the liquid crystal display device having the above-mentioned constitution (2), a depth of the rectangular-wave concavo-convex shape which the side of the poly-Si layer which is brought into contact with the n+Si layer assumes differs depending on a position of the side.

(5) In the liquid crystal display device having the above-mentioned constitution (1), the concavo-convex shape is a corrugated shape.

(6) In the liquid crystal display device having the above-mentioned constitution (5), a depth of the concavo-convex shape in a corrugated shape is set to 0.5 μm or more.

(7) In the liquid crystal display device having the above-mentioned constitution (5), a depth of the corrugated concavo-convex shape which the side of the poly-Si layer which is brought into contact with the n+Si layer assumes differs depending on a position of the side.

(8) According to another aspect of the present invention, there is provided a liquid crystal display device which includes: a display region in which pixel electrodes and pixel-use TFTs are arranged in a matrix array; and a driver circuit which includes a driver circuit-use TFT and is formed on a periphery of the display region, wherein the pixel-use TFT is a bottom-gate-type TFT in which an active layer is formed of an a-Si layer, the driver circuit-use TFT is a bottom-gate-type TFT in which an active layer is formed by stacking a poly-Si layer and an a-Si layer in order of the poly-Si layer and the a-Si layer, a through hole is formed in the a-Si layer and the poly-Si layer of the driver circuit-use TFT, an n+Si layer is formed so as to cover the a-Si layer and the poly-Si layer, and an SD electrode is formed so as to cover the n+Si layer, and the n+Si layer is brought into contact with the poly-Si layer via the through hole.

(9) In the liquid crystal display device having the above-mentioned constitution (8), the through hole has a square shape.

(10) According to still another aspect of the present invention, there is provided a liquid crystal display device which includes: a display region in which pixel electrodes and pixel-use TFTs are arranged in a matrix array; and a driver circuit which includes a driver circuit-use TFT and is formed on a periphery of the display region, wherein the pixel-use TFT is a bottom-gate-type TFT in which an active layer is formed of an a-Si layer, the driver circuit-use TFT is a bottom-gate-type TFT in which an active layer is formed by stacking a poly-Si layer and an a-Si layer in order of the poly-Si layer and the a-Si layer, an n+Si layer is formed so as to cover the a-Si layer and the poly-Si layer, and an SD electrode is formed so as to cover the n+Si layer, a side of the active layer at a position where the n+Si layer gets over the active layer assumes a concavo-convex shape, and the n+Si layer and the poly-Si layer are brought into contact with each other on the side which assumes a concavo-convex-shape, and a through hole is formed in the a-Si layer and the poly-Si layer, and the n+Si layer is brought into contact with the poly-Si layer via the through hole.

According to the present invention, it is possible to increase a quantity of a forward current of the bottom-gate-type poly- Si TFT in which the poly-Si layer and the a-Si layer are formed in a stacked manner. Accordingly, it is possible to form the poly-Si TFT which exhibits favorable process consistency with the a-Si TFT and hence, it is possible to manufacture a display device in which a-Si TFTs and poly-Si TFTs are formed on the same substrate in mixture.

According to the present invention, the a-Si TFT which exhibits a small leak current can be used in a pixel region, and the poly-Si TFT which exhibits a large ON current thus possessing a fast operation speed can be used in the driver circuit. Accordingly, it is possible to realize a driver-circuit-incorporated liquid crystal display device which makes use of the favorable properties of the TFTs of respective types. Further, the poly-Si TFT and the a-Si TFT exhibit the favorable process consistency therebetween and hence, the increase of a manufacturing cost of the liquid crystal display device can be suppressed.

BRIEF DESCRIPTION OF THE DRAWINGS

FIG. 8 is a plan view of a TFT of an embodiment 3;

DESCRIPTION OF THE PREFERRED EMBODIMENTS

The present invention is explained in detail in conjunction with embodiments.

Embodiment 1

A liquid crystal display device of this embodiment includes a plurality of pixels each of which is formed in a region surrounded by video signal lines which extend in the longitudinal direction and are arranged parallel to each other in the lateral direction and the scanning signal lines which extend in the lateral direction and are arranged parallel to each other in the longitudinal direction, wherein a pixel electrode and a TFT for switching are arranged in each pixel. The pixels each of which includes the pixel electrode and the TFT are arranged in a display region in a matrix array. On the periphery of the display region, a driver circuit which controls the supply of video signals to the respective pixels is arranged. In this embodiment, a TFT used in the pixel part is formed using a bottom-gate-type a-Si TFT, and a TFT used in the driver circuit is formed using a bottom-gate-type poly-Si TFT. Here, the a-Si TFT is a TFT in which an active layer is formed using a-Si, and the poly-Si TFT is a TFT in which an active layer is formed using poly-Si. Here, to consider a TFT in which a poly-Si layer and an a-Si layer are formed in a stacked manner, when a current substantially flows in the poly-Si layer, such a TFT is referred to as a poly-Si TFT.

Figure 1:
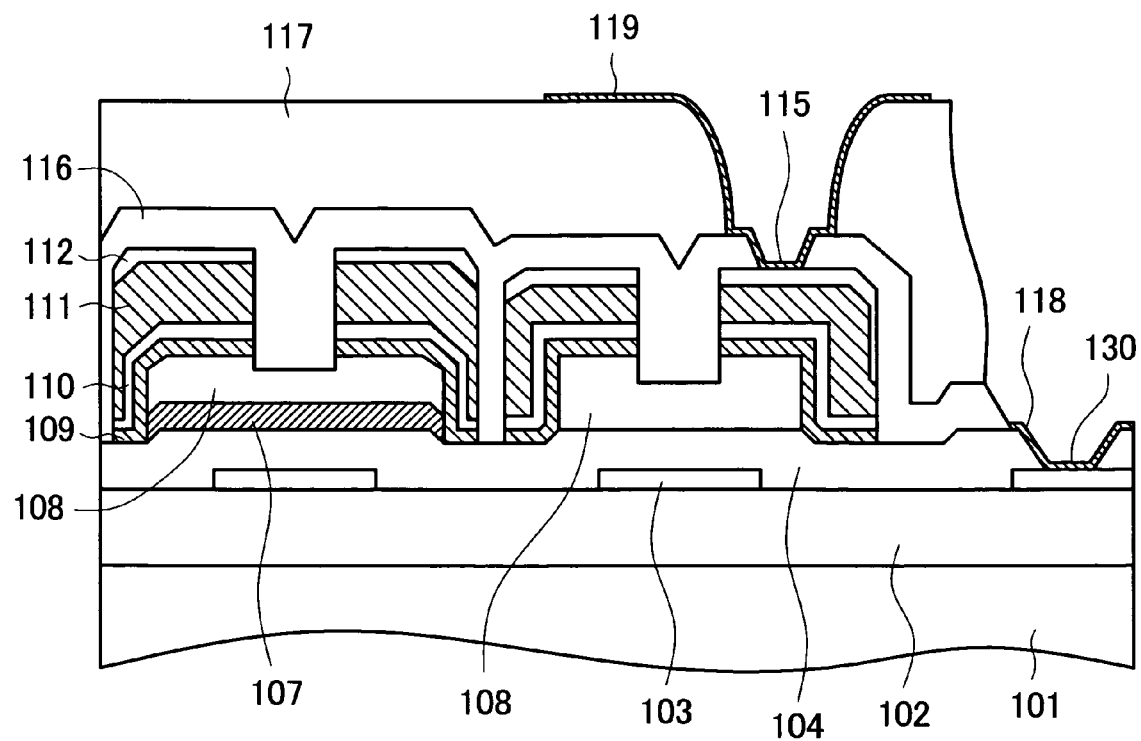
FIG. 1 is a schematic cross-sectional view of a liquid crystal display device of the present invention.

FIG. 1 is a schematic cross-sectional view showing the constitution of a portion of the liquid crystal display device of the present invention. In FIG. 1, the left-side TFT is a driver circuit-use TFT which is formed by stacking a poly-Si layer 107 and an a-Si layer 108. The right-side TFT is a pixel-use TFT. A terminal part is formed on a further right side of the pixel-use TFT. In FIG. 1, to make a clear comparison of the driver circuit-use TFT, the pixel-use TFT and the terminal part, these elements are described such that these elements are arranged adjacent to each other. However, in an actual display device, the respective elements are formed remote from each other.

In FIG. 1, a background film 102 is formed on the TFT substrate 101. Although the background film 102 is formed of a single SiN film layer in this embodiment, the background film 102 may be formed of a two-layered film consisting of the SiN film and an $SiO_2$ film. Gate electrodes 103 are formed on the background film 102. A gate insulation film 104 is formed so as to cover the gate electrodes 103. In the left-side driver circuit-use TFT shown in FIG. 1, the poly-Si layers 107 are formed on the gate insulation film 104. The poly-Si layer 107 constitutes a channel portion of the TFT. A thickness of the poly-Si layer 107 is approximately 50 nm. The a-Si layer 108 is formed so as to cover the poly-Si layer 107. A thickness of the a-Si layer 108 is approximately 150 nm.

An n+Si layer 109 is formed so as to cover the a-Si layer 108 and the poly-Si layer 107. The n+Si layer 109 is provided for decreasing a quantity of an OFF current. The n+Si layer 109 is covered with an SD electrode 113. The n+Si layer is brought into contact with an upper surface as well as side surfaces of the a-Si layer 108 and hence, the n+Si layer can ensure a sufficient contact area with the a-Si layer. However, the n+Si layer 109 is brought into contact with only side surfaces of the poly-Si layer 109 and hence, the n+Si layer cannot ensure a sufficient contact area with the poly-Si layer 109. In the TFT having such constitution, when an ON current flows in the TFT, resistance is increased thus making it difficult to ensure a sufficient flow of the ON current.

Figure 2:
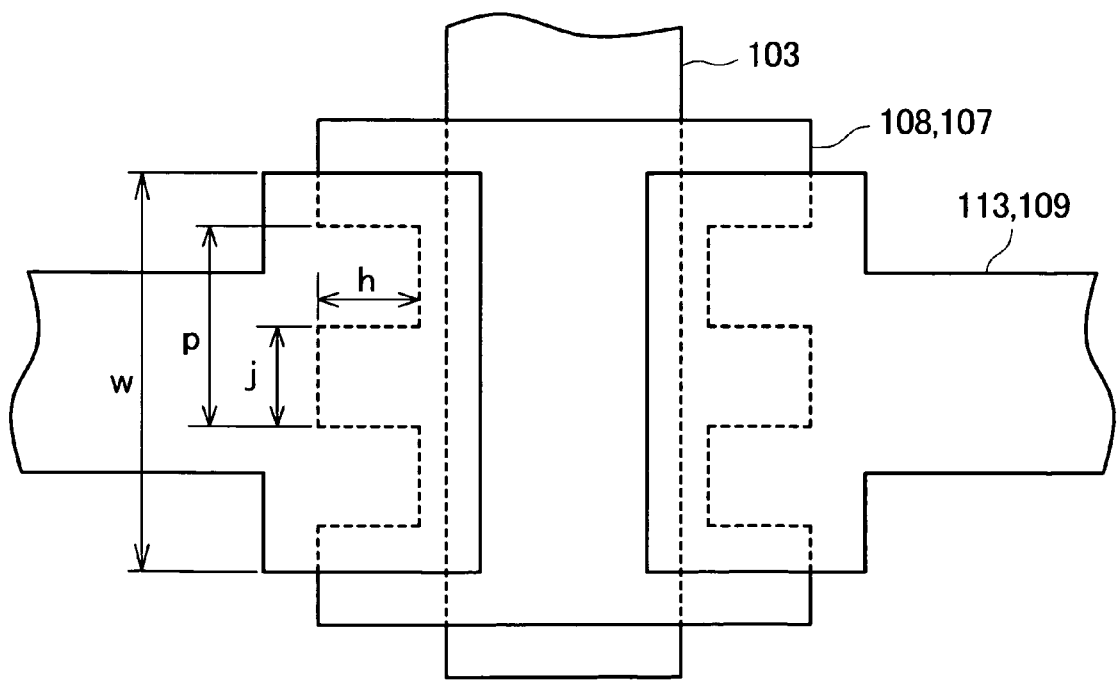
FIG. 2 is a plan view of a TFT of an embodiment 1.

To cope with the above-mentioned drawbacks, in this embodiment, as shown in FIG. 2, a boundary between the poly-Si layer and the a-Si layer assumes a rectangular-wave concavo-convex shape by patterning. As shown in FIG. 2, by forming the poly-Si layer and the a-Si layer in a rectangular-wave concavo-convex shape, a contact area between the poly-Si layer and the n+Si layer and a contact area between the a-Si layer and the n+Si layer can be increased.

FIG. 2 is a plan view and hence, the a-Si layer 108 is disposed below the SD electrode 113. The n+Si layer 109 is formed below the SD electrode 113. Resistance of the TFT when the ON current flows in the TFT is determined based on a contact between the side portion (edge portion) of the poly-Si layer 107 and the n+Si layer 109. Mobility of carriers in the poly-Si layer 107 is one hundred times or more as large as mobility of the carriers in the a-Si layer 108 and hence, the ON current is determined based on a quantity of electric current which flows in the poly-Si layer 107. Accordingly, the ON current is explained by taking a contact between the poly-Si layer 107 and the n+Si layer 109 as an example. In FIG. 2, a width of the SD electrode 113 which is formed on the a-Si layer 108 is indicated by symbol "w". Here, to consider a case where the boundary of the poly-Si layer 107 is formed of a simple straight line, assume a thickness of the poly-Si layer 107 as "t", a contact area between the n+Si layer 109 and the poly-Si layer 107 becomes "w×t". However, as shown in FIG. 2, by forming of boundary of the poly-Si layer 107 in a concavo-convex shape and setting a depth "h" and a width "j" of the concavo-convex shape to w/4, a contact area between the poly-Si layer 107 and the n+Si layer 109 becomes "2w×t". Accordingly, the contact area is increased twice as large as the contact area when the boundary of the poly-Si layer 107 is formed of a simple straight line so that the contact resistance between the poly-Si layer 107 and the n+Si layer 109 can be halved. Accordingly, the ON current can be increased twice. This advantageous effect is remarkable. Further, by decreasing a pitch "p" of the concavo-convex shape, the contact area can be further increased whereby it is possible to further increase a quantity of the ON current.

In this embodiment, a value of the depth "h" in FIG. 2 is set 0.5 μm or more. With respect to a shape of the boundary of the poly-Si layer 107, a minimum allowable size of the pitch "p" or an allowable minimum size of the width "j" is determined based on forming accuracy. An allowable maximum size of the width "h" in relation to the pitch "p" or the width "j" is also determined based on forming accuracy.

Returning to FIG. 1, the SD electrode 113 is formed on the a-Si layer. The SD electrode 113 is constituted of a barrier metal layer 110 made of molybdenum, an aluminum layer 111 and a cap metal layer 112 made of molybdenum. The whole TFT is protected by a passivation film 116 made of SiN. A leveling film formed of an organic film 117 is formed on the passivation film 116 so as to level a portion of the TFT where a pixel electrode 119 is formed.

In FIG. 1, on the right side of the driver circuit-use TFT, the pixel-use TFT is described. The pixel-use TFT substantially has the same structure as the driver circuit-use TFT except for that the pixel-use TFT is not provided with the poly-Si layer 107 in the channel portion. Since the driver circuit-use TFT requires a high-speed operation, poly-Si which exhibits large electron mobility is used for forming the channel portion of the driver circuit-use TFT. On the other hand, the pixel part does not require a high-speed operation comparable to a high-speed operation of the driver circuit portion and hence, the channel portion of the pixel-use TFT is formed using a-Si.

The SD electrode 113 of the pixel-use TFT is made conductive with the pixel electrode 119 so as to enable the supply of a data signal to the pixel part. That is, a through hole 115 is formed in the passivation film 116 and the leveling film formed of the organic film 117 which cover the pixel-use TFT, and the pixel electrode 119 and the SD electrode 113 are made conductive with each other via the through hole 115. The pixel electrode 119 is formed of a transparent conductive film made of ITO.

In FIG. 1, the terminal part is described on a further right side of the pixel-use TFT. In FIG. 1, a terminal-part-use line is formed on the same layer as the gate electrode 103. That is, the terminal-part-use line is simultaneously formed with the gate electrode 103 using the same material as the gate electrode 103. The terminal-part-use line is protected by the passivation film 116 and the leveling film. In the terminal part, a terminal part contact hole 118 is formed in the passivation film and the leveling film for connection with an external circuit.

The terminal-part-use line is made of metal and hence, the terminal-part-use line is liable to be corroded due to an external environment. To prevent the corrosion of the terminal-part-use line, the terminal part is covered with a metal-oxide conductive film 130. ITO is used for forming the metal-oxide conductive film. The terminal part made of ITO is simultaneously formed with the pixel electrode 119 which is also made of ITO.

Figure 3A:
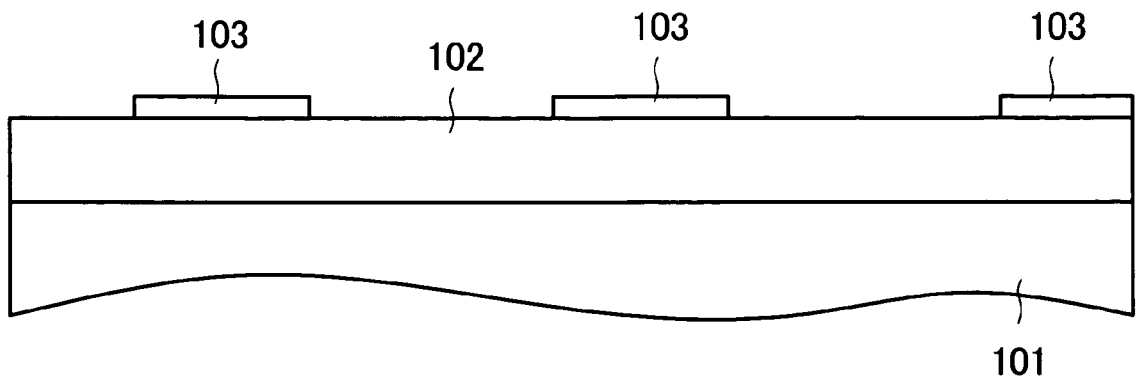
FIGS. 3A to 3C are views showing steps of a manufacturing process of the liquid crystal display device of the embodiment 1.

FIGS. 3A-3B to FIGS. 6A-6B show a process of forming the TFTs and the terminal part shown in FIG. 1. As shown in FIG. 3A, the background film 102 made of SiN is formed on the TFT substrate 101 by a plasma CVD method. Thereafter, a line layer for forming the gate electrode 103 is formed as a film by sputtering, and the line layer is formed in a desired shape by a photolithography step. The gate electrode 103 is formed using a high-melting-point material (Mo-based material) by taking a laser annealing step performed following this step into consideration.

Figure 3B:
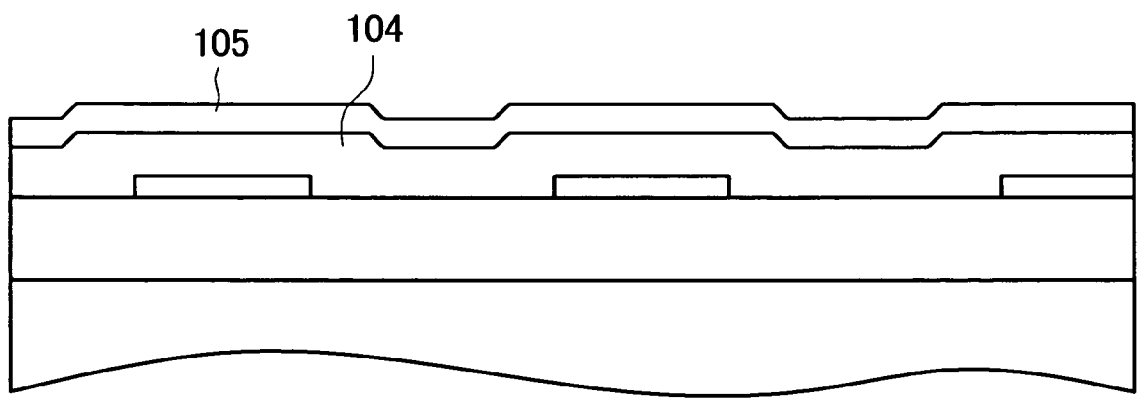
Figure 3C:
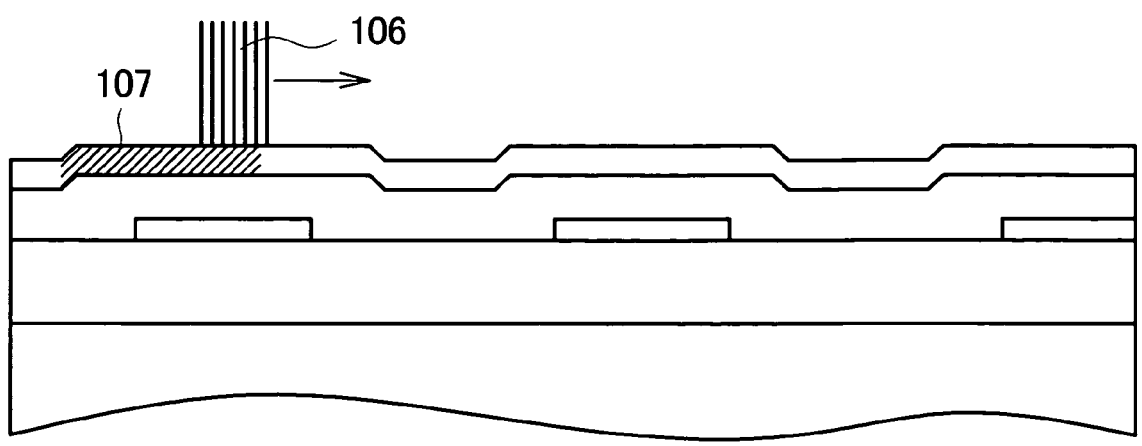

In FIG. 3B, an SiO$_2$ film for forming the gate insulation film 104 is formed by a plasma CVD method and, subsequently, an a-Si film 105 is formed by a plasma CVD method. The a-Si film 105 is transformed into a poly-Si film 107 by laser annealing. For applying laser annealing to the a-Si film, dehydrogenation processing (annealing at a temperature of 450° C. or more) is performed thus removing hydrogen in the a-Si film. Thereafter, in FIG. 3C, a-Si is transformed into poly-Si by laser beams 106 generated by a solid laser which performs continuous oscillations.

Figure 4A:
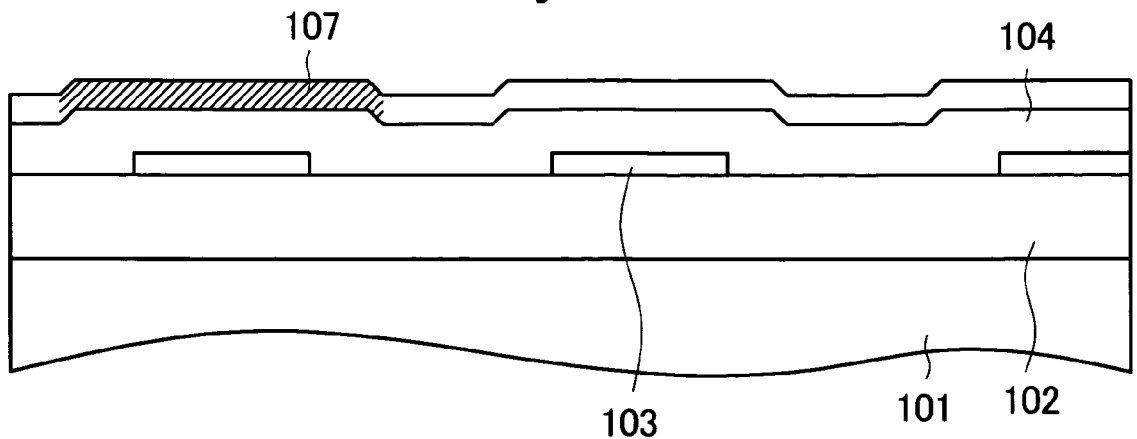
FIGS. 4A to 4C are views showing steps of the manufacturing process of the liquid crystal display device of the embodiment 1 which follow the steps shown in FIG. 3A to FIG. 3C.
Figure 4B:
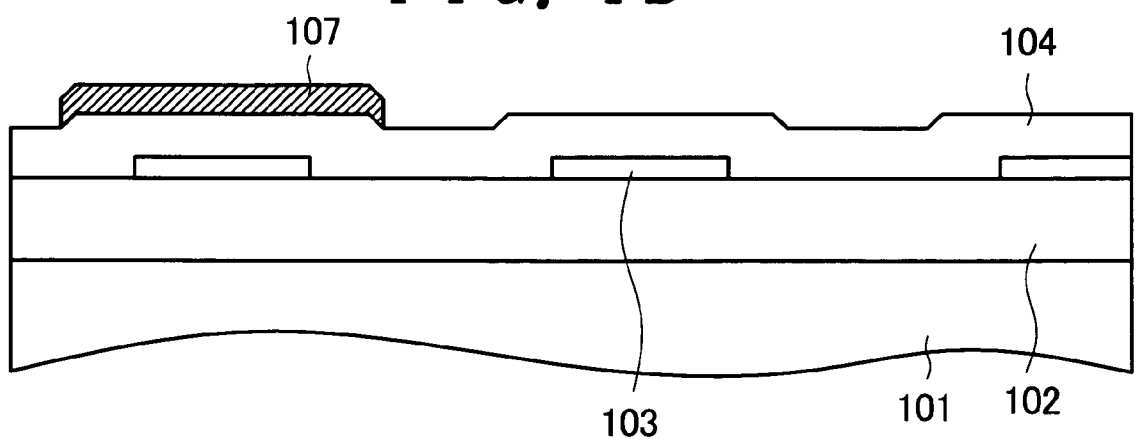

As shown in FIG. 4A, due to the radiation of laser beams to the a-Si layer 105, the a-Si layer 105 is transformed into the poly-Si layer 107. In FIG. 4A and the like, although the laser beams are radiated to only one TFT, in an actual operation, the laser beams are simultaneously radiated to a region in which a large number of drive-part-use TFTs are formed. As shown in FIG. 4B, by applying a photolithography step and an etching step to the poly-Si layer 107 having such a constitution, an active layer which is constituted of the poly-Si layer 107 is formed.

Figure 4C:
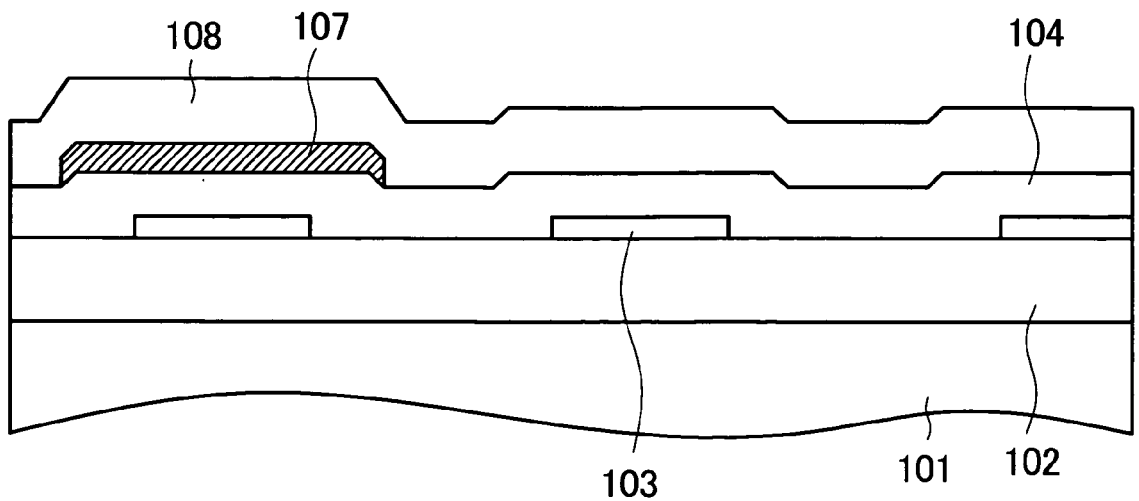
Figure 5A:
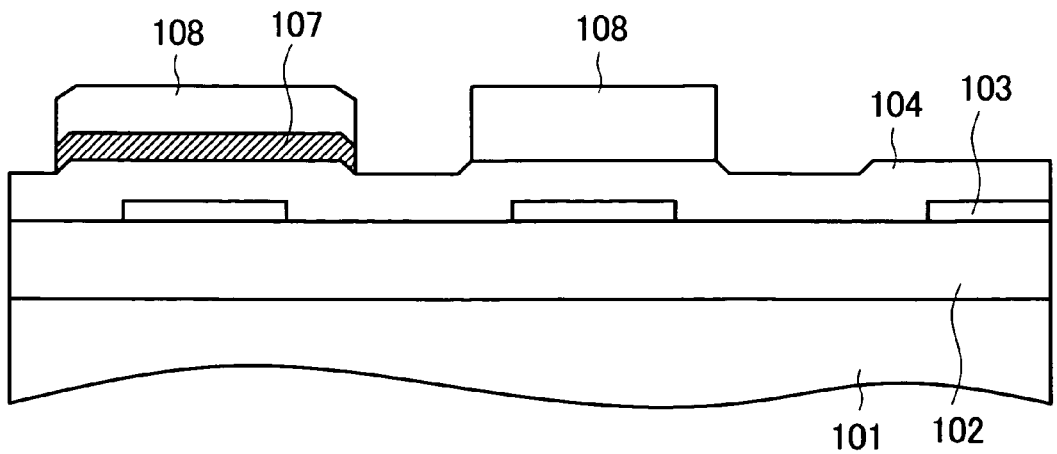
FIGS. 5A to 5C are views showing steps of the manufacturing process of the liquid crystal display device of the embodiment 1 which follow the steps shown in FIG. 4A to FIG. 4C.

Next, as shown in FIG. 4C, the a-Si layer 108 is formed so as to cover the poly-Si layer 107 by the plasma CVD method. Thereafter, as shown in FIG. 5A, an a-Si layer and a poly-Si layer are formed by a photolithography step. In such a photolithography step, the poly-Si layer and the a-Si layer are respectively formed in shapes shown in FIG. 5A. Further, due to such formation, the a-Si layer and the poly-Si layer are formed in the same shape.

Figure 5B:
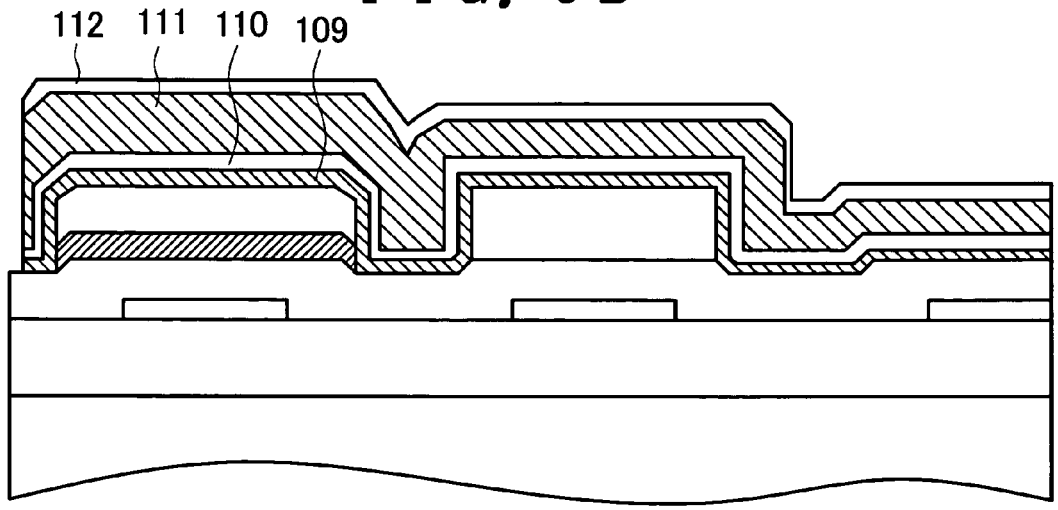

Thereafter, as shown in FIG. 5B, the n+Si layer 109 doped with phosphorous is formed on the a-Si layer 108 by a plasma CVD method. The n+Si layer is provided for forming a depletion layer between the a-Si layer and the poly-Si layer thus suppressing a leak current at a low level. The SD electrode layer 113 is formed so as to cover the n+Si layer. The SD electrode layer 113 is formed simultaneously with the data signal line on the same layer as the data signal line. As shown in FIG. 5B, the SD electrode layer 113 is constituted of three layers consisting of the barrier metal layer 110, the aluminum layer 111 and the cap metal layer 112. The barrier metal layer 110 and the cap metal layer 112 are made of molybdenum. Although the electrical conduction or connection of the SD electrode 113 is mainly allocated to aluminum, molybdenum is used for preventing hillock of aluminum or for preventing contact failure attributed to the oxidation of aluminum when aluminum and ITO are brought into contact with each other.

Figure 5C:
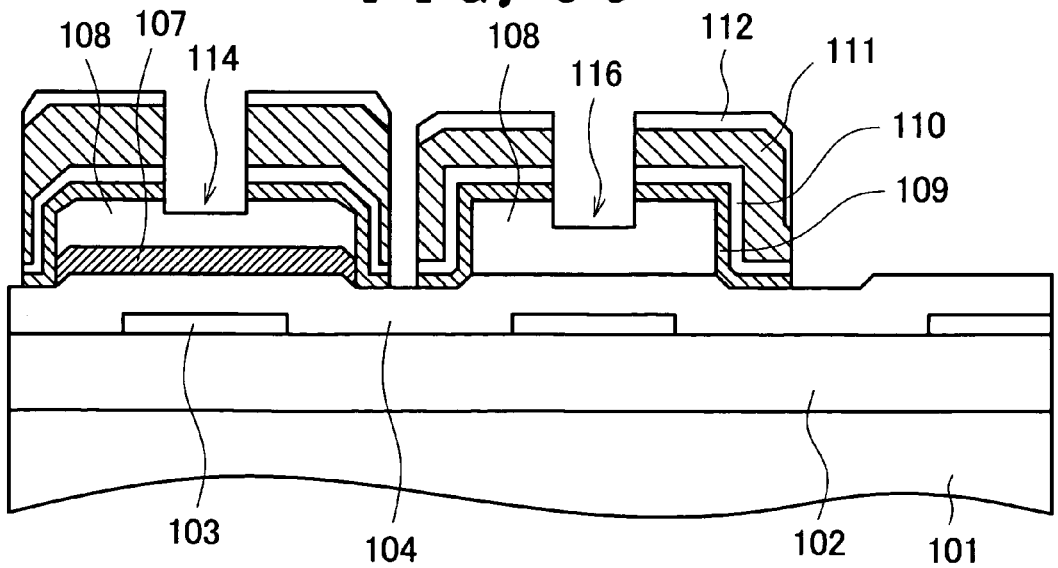

As shown in FIG. 5C, the SD electrode 113 is formed into a desired shape by a photolithography step and an etching step. Further, using the SD electrode 113 as a mask, the n+Si layer 109 is removed by dry etching. Here, channel etching is also performed so as to remove a portion of the a-Si layer existing between the source and the drain of the TFT thus stabilizing the property of the TFT. Next, as shown in FIG.

6A, in a gate line in the terminal part, that is, in a line potion of the terminal part, the terminal part contact hole 118 is formed in the gate insulation film 104 by photo-etching.

Figure 6A:
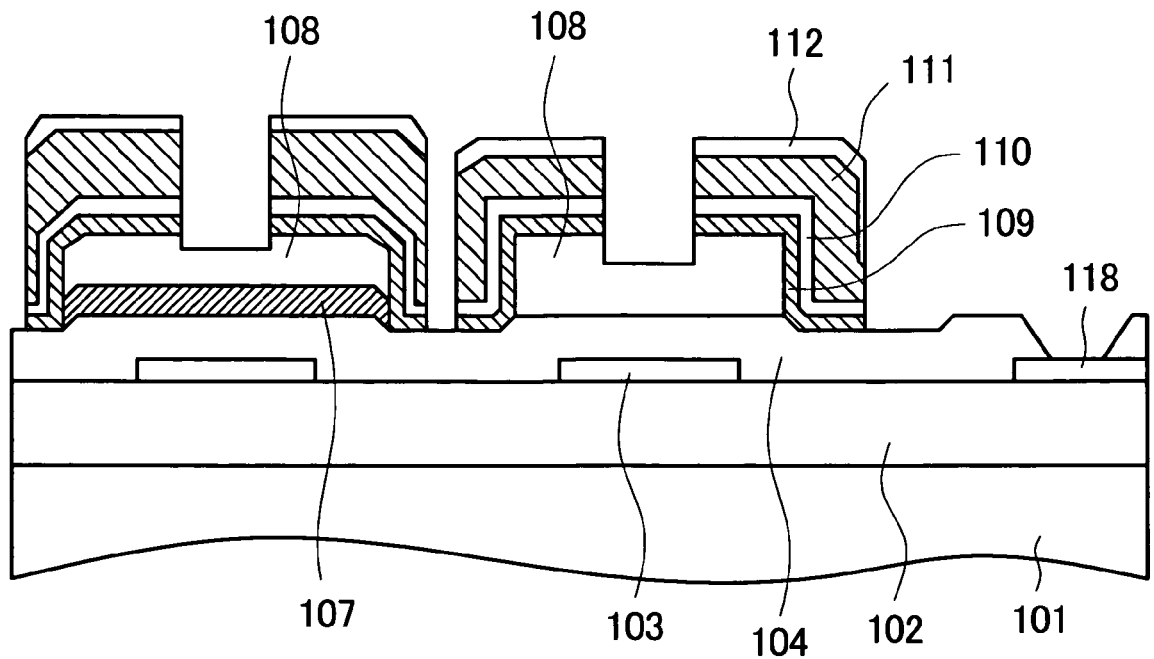
FIGS. 6A and 6B are views showing steps of the manufacturing process of the liquid crystal display device of the embodiment 1 which follow the steps shown in FIG. 5A to FIG. 5C.
Figure 6B:
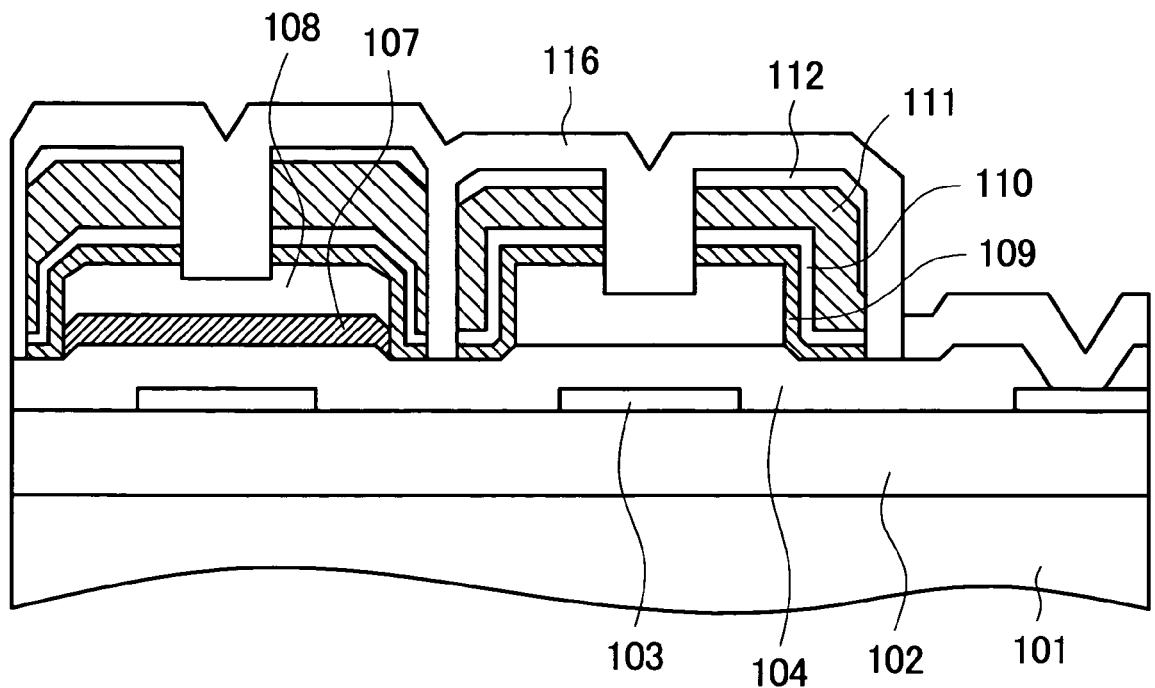

Thereafter, as shown in FIG. 6B, the whole TFT is covered with the passivation film 116 made of SiN. The passivation film 116 made of SiN is formed by a plasma CVD method. Then, as shown in FIG. 1, a photosensitive organic film 117 is applied to the passivation film 116 for leveling by coating, and the organic film 117 is formed into a desired shape by a photolithography step. A film thickness of the organic film 117 is approximately 1 to 2 μm. Using the organic film 117 as a mask, the passivation film 116 made of SiN is etched thus forming a contact hole. Then, an ITO film for forming the pixel electrode 119 is formed by sputtering, and the ITO film is formed into a desired shape by photo etching thus forming the pixel electrode 119. Eventually, the constitution shown in FIG. 1 is acquired.

Using FIGS. 3A-3C to 6A-6B, the explanation has been made mainly with respect to the steps of forming the TFT shown on a left side of the drawings in which the poly-Si layer and the a-Si layer are formed in a stacked manner. The steps of forming the a-Si TFT shown on a right side of the FIGS. 3A-3C to 6A-6B are substantially equal to the steps of forming the TFT on a left side of FIGS. 3A-3C to 6A-6B except for that the a-Si TFT shown on a right side of the drawings has no poly-Si layer. In this case, in FIG. 5A, in etching the poly-Si layer and the a-Si layer of the left-side TFT, the a-Si layer of the right-side TFT is also simultaneously etched. A contact portion of the right-side a-Si layer with the n+Si layer is not always necessary to assume a concavo-convex shape shown in FIG. 3. This is because that the a-Si layer has an upper surface thereof also brought into contact with the n+Si layer and hence, it is possible to ensure a sufficient contact area.

In this manner, the driver circuit-use TFT which uses the poly-Si layer 107 as the channel thereof and the pixel-use TFT which uses the a-Si layer 108 as the channel thereof are formed on the same substrate simultaneously.

Embodiment 2

Figure 7:
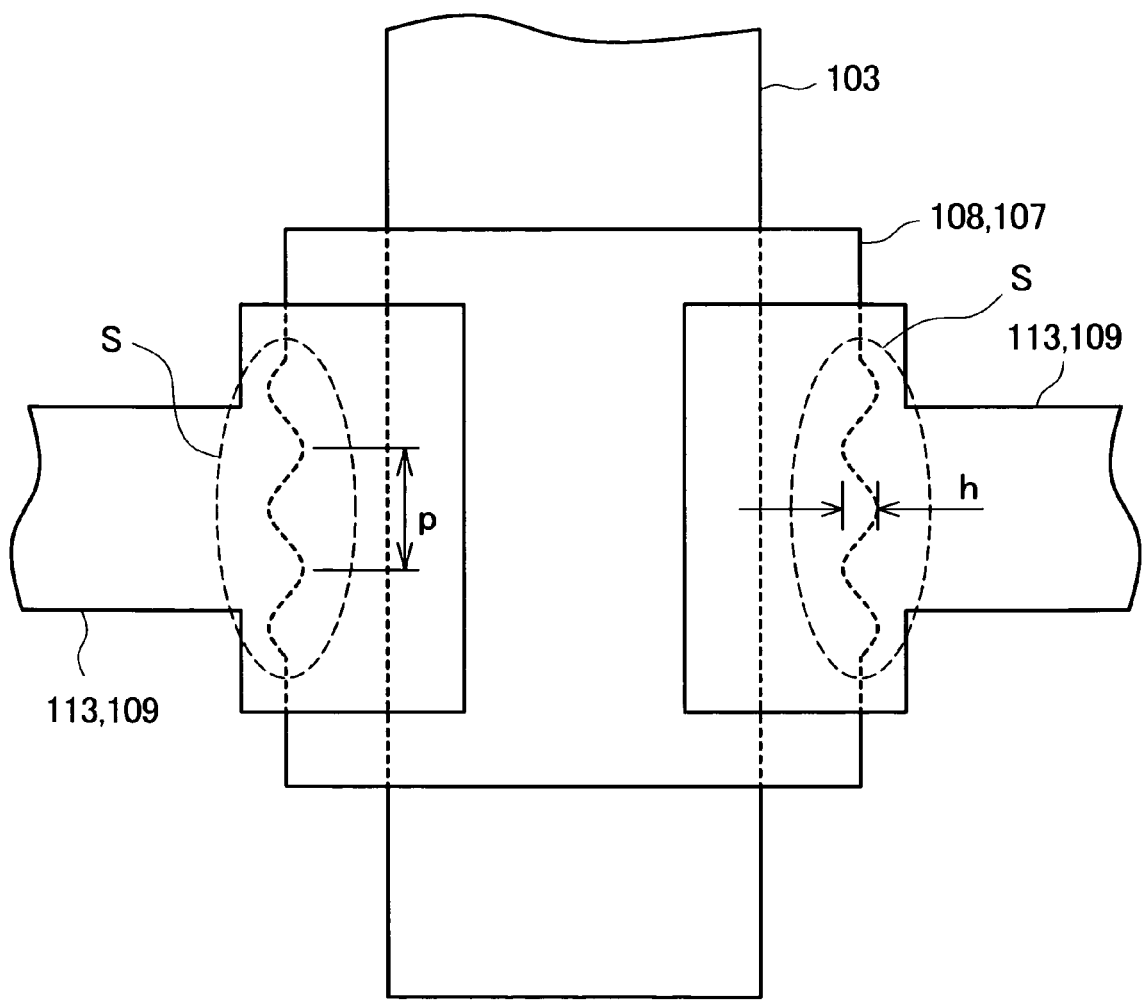
FIG. 7 is a plan view of a TFT of an embodiment 2.

FIG. 7 is a plan view of a TFT of the embodiment 2 according to the present invention. In FIG. 7, a poly-Si layer and an a-Si layer are stacked on a gate electrode by way of a gate insulation film. In the same manner as the constitution of the embodiment 1 shown in FIG. 2, an upper portion of the a-Si layer, a side portion (edge portion) of the a-Si layer, and a side portion (edge portion) of the poly-Si layer are covered with an n+Si layer and an SD electrode.

A point which makes this embodiment different from the embodiment 1 shown in FIG. 2 lies in that a side of the poly-Si layer which is brought into contact with the n+Si layer does not assume a concavo-convex shape but assumes a corrugated shape or a wave shape. A film thickness of the poly-Si layer is set to 50 nm and a film thickness of the a-Si layer is set to 150 nm, while a film thickness of the n+Si layer is set to approximately 50 nm. In this case, the n+Si layer is liable to be cause breaking of step when the n+Si layer gets over the poly-Si layer and the a-Si layer. When the breaking of step of the n+Si layer occurs, there may be a case where the SD electrode is brought into direct contact with poly-Si layer. When the poly-Si layer is brought into direct contact with the SD electrode without interposing the n+Si layer therebetween, a leak current is liable to be increased. When an end portion of the poly-Si layer assumes a rectangular-wave concavo-convex shape, such breaking of step is liable to occur particularly at corner portions of a rectangular-wave concavo-convex shape.

In this embodiment, by forming the side of the poly-Si layer which is brought into contact with the n+Si layer not in a rectangular-wave concavo-convex shape but in a corrugated shape, the formation of sharp corner portions is prevented thus reducing a possibility of the occurrence of breaking of step. Even when the side of the poly-Si layer assumes a shape shown in FIG. 7, by increasing a corrugation height "h" of the corrugation or decreasing a pitch "p" of the corrugation, it is possible to ensure a necessary contact area between the poly-Si layer and the n+Si layer.

Embodiment 3

FIG. 8 is a plan view of a TFT of the embodiment 3 according to the present invention. In FIG. 8, a poly-Si layer and an a-Si layer are stacked on a gate electrode by way of a gate insulation film. An upper portion of the a-Si layer, a side portion (edge portion) of the a-Si layer and a side portion (edge portion) of the poly-Si layer are covered with an n+Si layer and the SD electrode in the same manner as the constitution of the embodiment 1 shown in FIG. 2.

A point which makes this embodiment different from the embodiment 1 shown in FIG. 2 lies in that although a side of the poly-Si layer which is brought into contact with the n+Si layer assumes a concavo-convex shape, a depth of the concavo-convex portion differs depending on a position of the side of the poly-Si layer. The n+Si layer or the SD electrode does not have a uniform width over the whole length thereof. For example, as shown in FIG. 8, there may be a case where a width of the n+Si layer or the SD electrode in the vicinity of the channel portion is set larger than a width of the n+Si layer or the SD electrode at a portion other than the channel portion. In such a case, by increasing a depth of the concavo-convex shape at a portion of the poly-Si layer which is widely covered with the SD electrode, it is possible to increase the contact area between the poly-Si layer and the SD electrode.

In FIG. 8, although a side of the poly-Si layer which is brought into contact with the n+Si layer assumes a concavo-convex shape, the shape of the poly-Si layer is not limited to such a shape and may assume a corrugated shape or a wave shape described in the embodiment 2 and, further, a height of the corrugated shape may be changed depending on a portion of the side of the poly-Si layer. That is, in this embodiment, irrespective of whether the shape of the poly-Si layer assumes a concavo-convex shape or a corrugated shape, by changing a depth of the concavo-convex shape or by changing a height of the corrugated shape, it is possible to increase the contact area between the poly-Si layer and the n+Si layer.

Embodiment 4

Figure 9A:
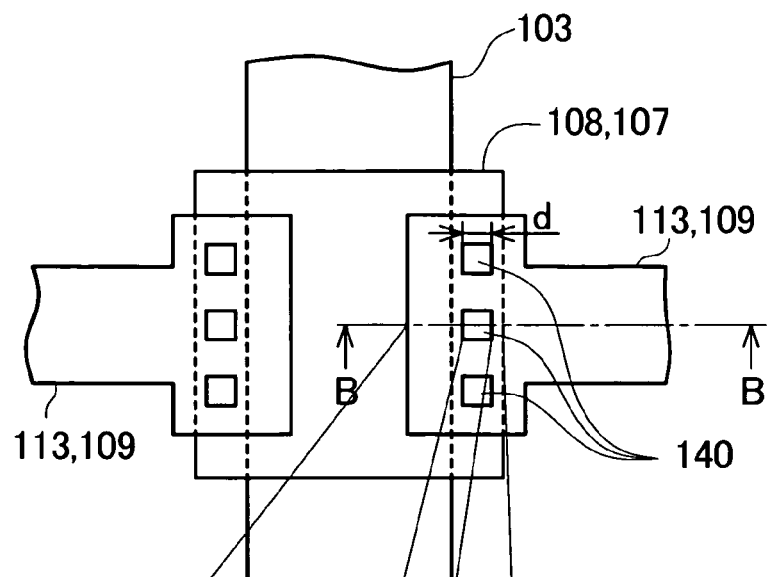
FIGS. 9A and 9B are views showing a TFT of an embodiment 4.
Figure 9B:
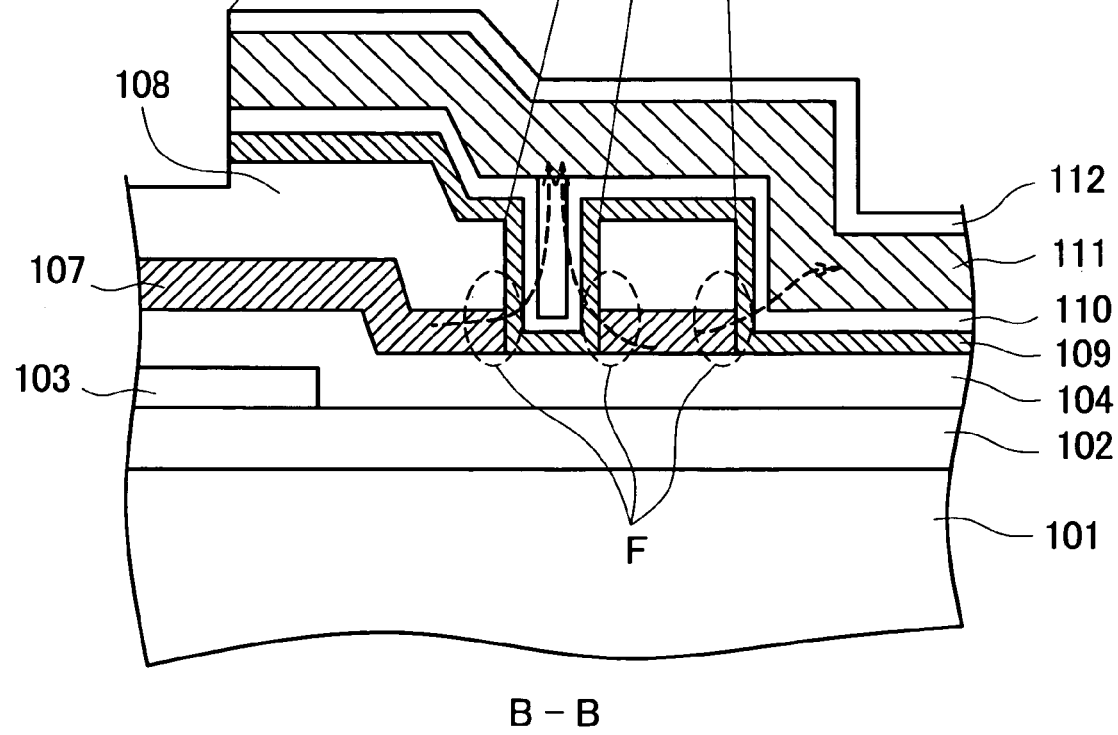
Figure 10A:
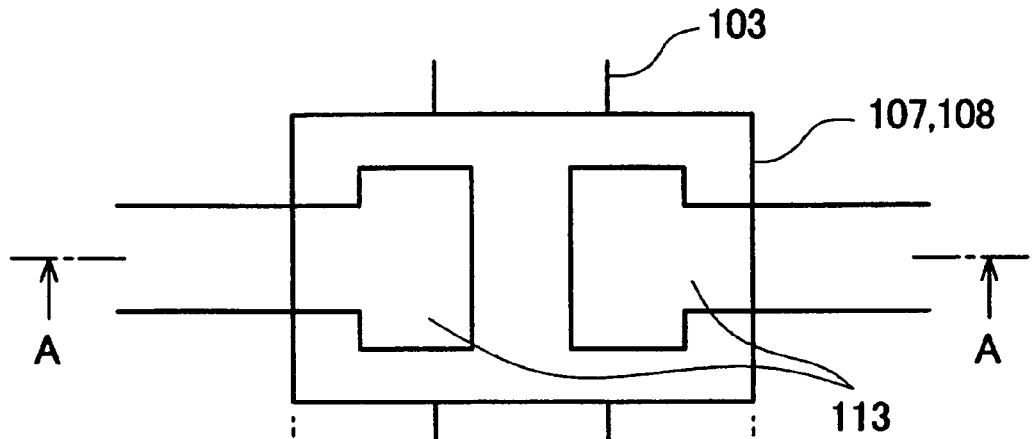
FIGS. 10A and 10B are views showing the structure of a TFT used in a conventional liquid crystal display device.
Figure 10B:
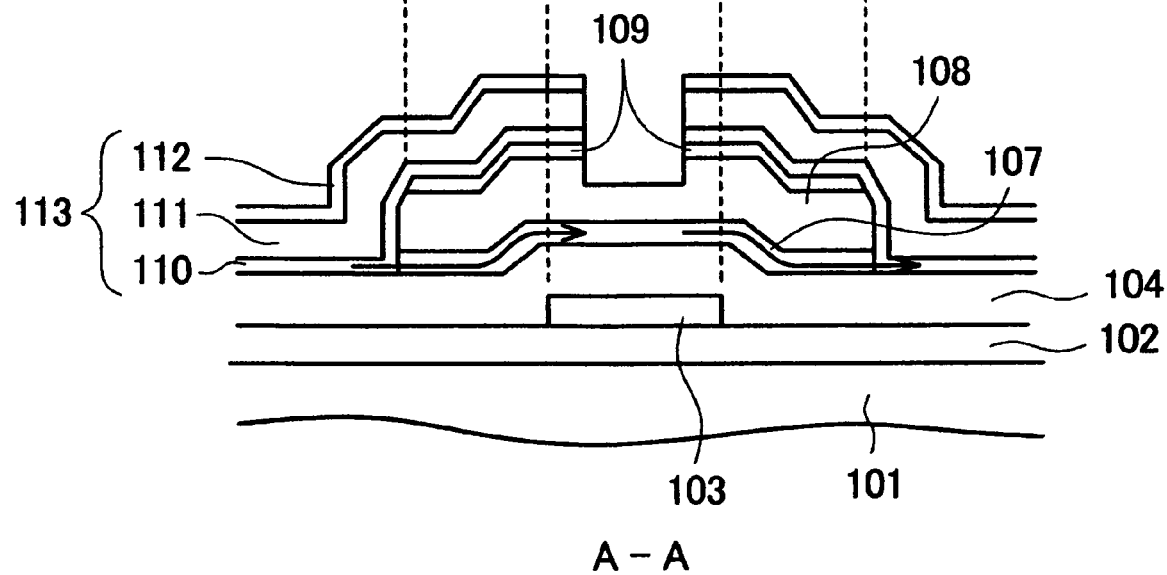
Figure 11A:
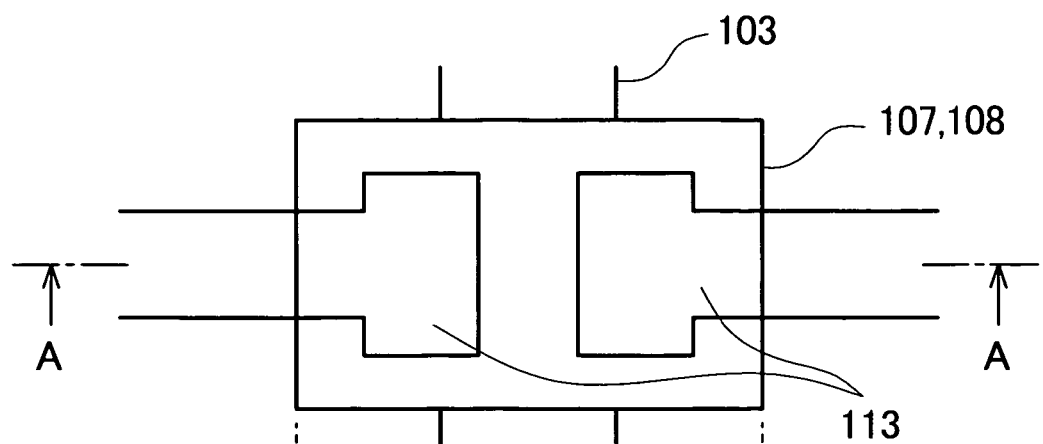
FIGS. 11A and 11B are views showing the structure of a TFT which can cope with an OFF current.
Figure 11B:
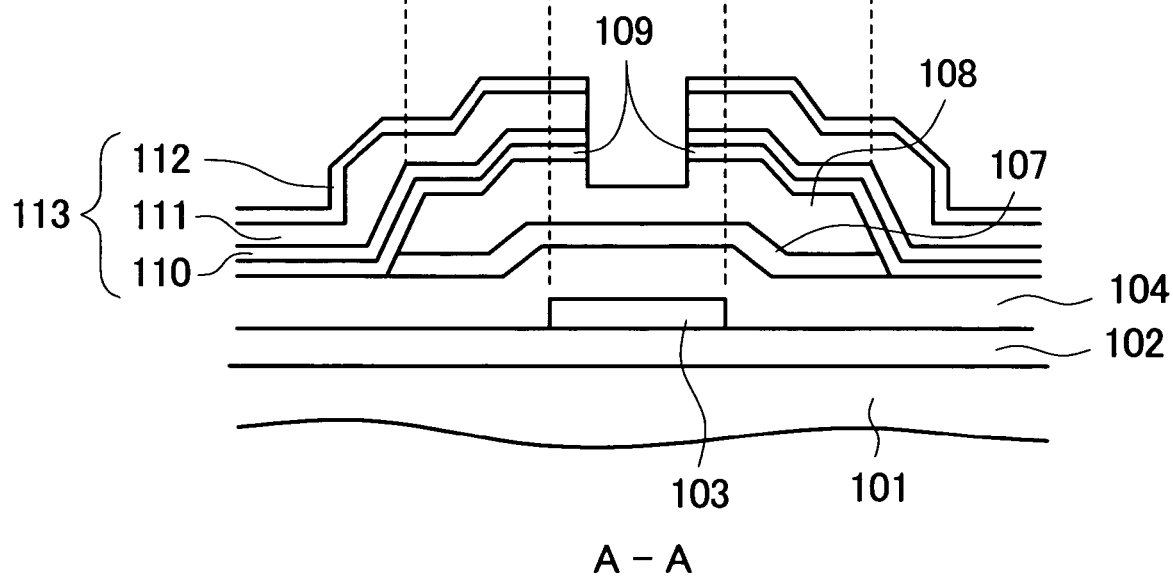

FIGS. 9A and 9B are views showing a TFT of an embodiment 4 of the present invention. FIG. 9A is a plan view and FIG. 9B is a cross-sectional view taken along a line B-B in FIG. 9A. A point which makes this embodiment different from the embodiments 1 to 3 lies in that, to increase the contact area between the n+Si layer and the poly-Si layer, instead of changing a shape of the side of the poly-Si layer, poly-Si-layer-use through holes 140 are formed in the poly-Si layer and the a-Si layer.

In FIG. 9A, the constitution of the TFT is equal to the constitution of the TFT which is explained in conjunction with the embodiments 1 to 3. In FIG. 9A, three through holes are formed in a drain region of the TFT and, at the same time, three through holes are formed in a source region. FIG. 9B shows a cross-section of the TFT which includes these through holes. In FIG. 9B, the cross-sectional structure of the TFT is substantially equal to the cross-sectional structure of the TFT explained in conjunction with the embodiment 1. The constitution shown in FIG. 9B is characterized in that the poly-Si-layer-use through holes 140 are formed in the poly-Si layer and the a-Si layer.

By forming the poly-Si-layer-use through holes 140, it is possible to provide portions respectively having an area where the n+Si layer and the poly-Si layer are brought into contact with each other. That is, by forming the poly-Si-layer-use through hole 140 in a square shape whose each side has a size of "d" and by setting a film thickness of the poly-Si layer to "t", it is possible to increase the contact area between the n+Si layer and the poly-Si layer by 4d×t per one poly-Si-layer-use through hole 140. By forming three poly-Si-layer-use through holes 140, it is possible to increase the contact area three times compared to the case where one poly-Si-layer-use through hole 140 is formed, that is, the contact area becomes 12d×t. An arrow indicated by a dotted line in FIG. 9B indicates the direction that an electric current flows. The electric current, in the same manner as the related art, flows in a side portion (edge portion) of the poly-Si layer and, at the same time, in a poly-Si side portion (edge portion) of the poly-Si-layer-use through hole 140.

Although a planar shape of the poly-Si-layer-use through hole 140 shown in FIG. 9A assumes a square shape, it is needless to say that corner portions of the through hole 140 may be rounded in forming the poly-Si-layer-use through hole 140 in a square shape. Further, the planar shape of the poly-Si-layer-use through hole 140 poly-Si layer is not limited to the square shape and the poly-Si-layer-use through hole 140 may assume a rectangular shape, a circular shape or an elliptical shape. That is, the poly-Si-layer-use through hole 140 may assume any shape which allows, in a state that the n+Si layer and the active layer overlap with each other, the easy formation of the poly-Si-layer-use through hole 140 and the easy acquisition of the contact area.

The poly-Si-layer-use through hole 140 does not require a particular photolithography step. That is, as has been explained in conjunction with FIG. 5A which shows the embodiment 1, it is sufficient that the poly-Si-layer-use through hole 140 is simultaneously formed with etching of the poly-Si layer and the a-Si layer. That is, it is sufficient to change a mask in the photolithography step and hence, the manufacturing steps of this embodiment are substantially equal to the manufacturing steps of the embodiment 1, 2 or 3.

It may be possible to combine the constitution explained in conjunction with the embodiments 1 to 3 in which the contact area between the n+Si layer and the poly-Si layer is increased by forming the side of the active layer in a concavo-convex shape and the constitution explained in conjunction with the embodiment 4 in which the contact area between the n+Si layer and the poly-Si layer is increased by forming the poly-Si-layer-use through hole 140. Due to such combination, it is possible to further increase a quantity of the ON current which flows in the TFT.

As has been explained heretofore, according to the present invention, in the TFT of a type where the poly-Si layer and the a-Si layer are stacked, a quantity of forward current can be increased thus increasing an operation speed of the TFT which is particularly used in the driver circuit. Further, the particular process is unnecessary for acquiring such an advantageous effect and hence, it is possible to enhance the property of the TFT without pushing up a manufacturing cost.

What is claimed is:

1. A liquid crystal display device comprising:
    a display region in which pixel electrodes and pixel-use TFTs are arranged in a matrix array; and
    a driver circuit which includes a driver circuit-use TFT and is formed on a periphery of the display region, wherein
    the pixel-use TFT is a bottom-gate-type TFT in which an active layer is formed of an a-Si layer,
    the driver circuit-use TFT is a bottom-gate-type TFT in which an active layer is formed by stacking a poly-Si layer and an a-Si layer in order of the poly-Si layer and the a-Si layer, an n+Si layer is formed so as to cover the a-Si layer and the poly-Si layer, and an SD electrode is formed so as to cover the n+Si layer, and
    a side of the poly-Si layer which is brought into contact with the n+Si layer assumes a rectangular-wave concavo-convex shape.

2. A liquid crystal display device according to claim 1, wherein a depth of the concavo-convex shape is set to 0.5 μm or more.

3. A liquid crystal display device according to claim 1, wherein the rectangular-wave concavo-convex shape comprises at least two different depths.

4. A liquid crystal display comprising:
    a display region in which pixel electrodes and pixel-use TFTs are arranged in a matrix array; and
    a driver circuit which includes a driver circuit-use TFT and is formed on a periphery of the display region, wherein
    the pixel-use TFT is a bottom-gate-type TFT in which an active layer is formed of an a-Si layer,
    the driver circuit-use TFT is a bottom-gate-type TFT in which an active layer is formed by stacking a poly-Si layer and an a-Si layer in order of the poly-Si layer and the a-Si layer, an n+Si layer is formed so as to cover the a-Si layer and the poly-Si layer, and an SD electrode is formed so as to cover the n+Si layer, and
    a side of the poly-Si layer which is brought into contact with the n+Si layer assumes a corrugated concavo-convex shape.

5. A liquid crystal display device according to claim 4, wherein a depth of the concavo-convex shape in a corrugated shape is set to 0.5 μm or more.

6. A liquid crystal display device according to claim 4, wherein the corrugated concavo-convex shape comprises at least two different depths.

* * * * *